United States Patent
Nagarajan et al.

(10) Patent No.: US 12,302,491 B2
(45) Date of Patent: May 13, 2025

(54) ELECTRICAL SYSTEM WITH HOOK-AND-LOOP BUSBARS

(71) Applicants: University of Massachusetts, Boston, MA (US); U.S. Government, Natick, MA (US)

(72) Inventors: Ramaswamy Nagarajan, Shrewsbury, MA (US); Jayant Kumar, Westford, MA (US); Ravi Mosurkal, Westford, MA (US); Siddhant Iyer, Canton, MA (US); Claire Lepont, Arlington, MA (US); Lian Li, North Chelmsford, MA (US)

(73) Assignee: University of Massachusetts, Westborough, MA (US)

(*) Notice: Subject to any disclaimer, the term of this patent is extended or adjusted under 35 U.S.C. 154(b) by 177 days.

(21) Appl. No.: 18/194,589

(22) Filed: Mar. 31, 2023

(65) Prior Publication Data

US 2024/0098887 A1     Mar. 21, 2024

Related U.S. Application Data

(60) Provisional application No. 63/325,906, filed on Mar. 31, 2022.

(51) Int. Cl.
*H05K 1/02* (2006.01)
*H05K 1/18* (2006.01)
*H05K 3/32* (2006.01)
*H01L 31/02* (2006.01)

(52) U.S. Cl.
CPC .......... *H05K 1/0263* (2013.01); *H05K 1/189* (2013.01); *H05K 3/32* (2013.01); *H01L 31/0201* (2013.01); *H05K 2201/10272* (2013.01)

(58) Field of Classification Search
CPC ........ H05K 1/0263; H05K 1/189; H05K 3/32; H05K 2201/10272
USPC ....................................................... 361/775
See application file for complete search history.

(56) References Cited

U.S. PATENT DOCUMENTS

| | | |
|---|---|---|
| 7,285,579 B2 | 10/2007 | Ghoshal |
| 7,994,246 B2 | 8/2011 | Morita |
| 9,082,899 B2 | 7/2015 | Jiang |
| 9,200,184 B2 | 12/2015 | Gao et al. |
| 9,773,579 B2 | 9/2017 | Jiang |
| 10,665,730 B2 | 5/2020 | Pepin |

(Continued)

*Primary Examiner* — Andargie M Aychillhum
(74) *Attorney, Agent, or Firm* — Joshua A. Stockwell, Esq.

(57) ABSTRACT

A flexible circuit module is disclosed. The flexible circuit module includes a fabric member including a plurality of fibers having non-conductive elements, and conductive elements oriented through the plane of the fabric. Each conductive element includes a first fiber element strand and a first unterminated end opposite the first fiber element strand, and a second fiber element strand having second unterminated end opposite the second fiber element strand. The fabric member further includes a first side with the first fiber element strands extending therefrom and a second side with second fiber element strands extending therefrom. A first hook-and-loop busbar is conductively connected to the first fiber element strands and a second hook-and-loop busbar is conductively connected to the second fiber element strands.

17 Claims, 7 Drawing Sheets

(56) References Cited

U.S. PATENT DOCUMENTS

2008/0308641 A1\* 12/2008 Finn .................... H04B 5/77
            235/492
2021/0064161 A1\* 3/2021 Sundara-Rajan ....... G06F 3/041

\* cited by examiner

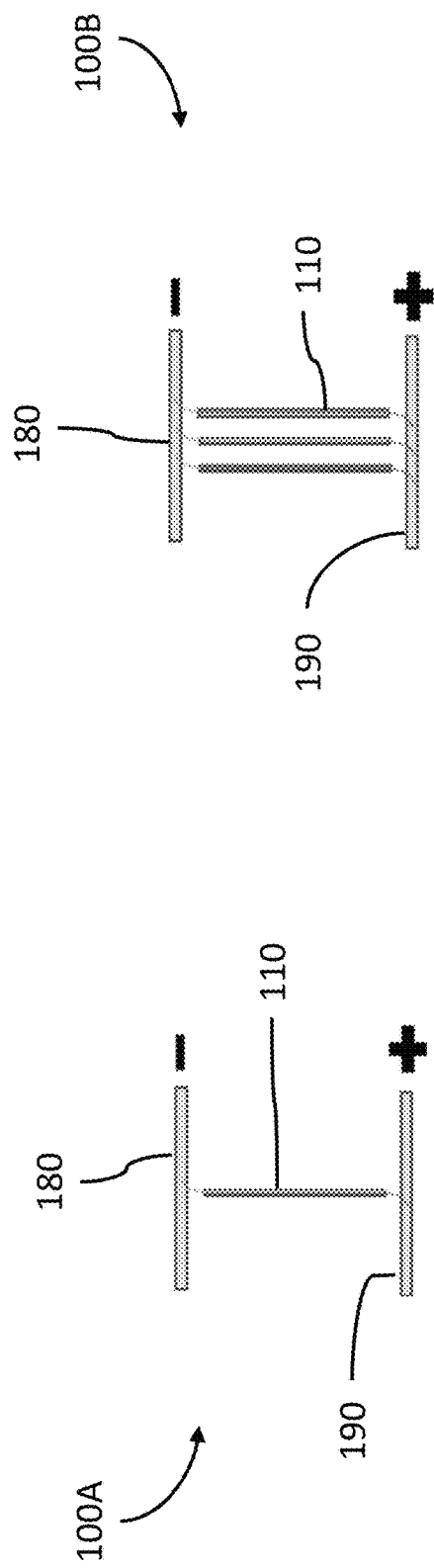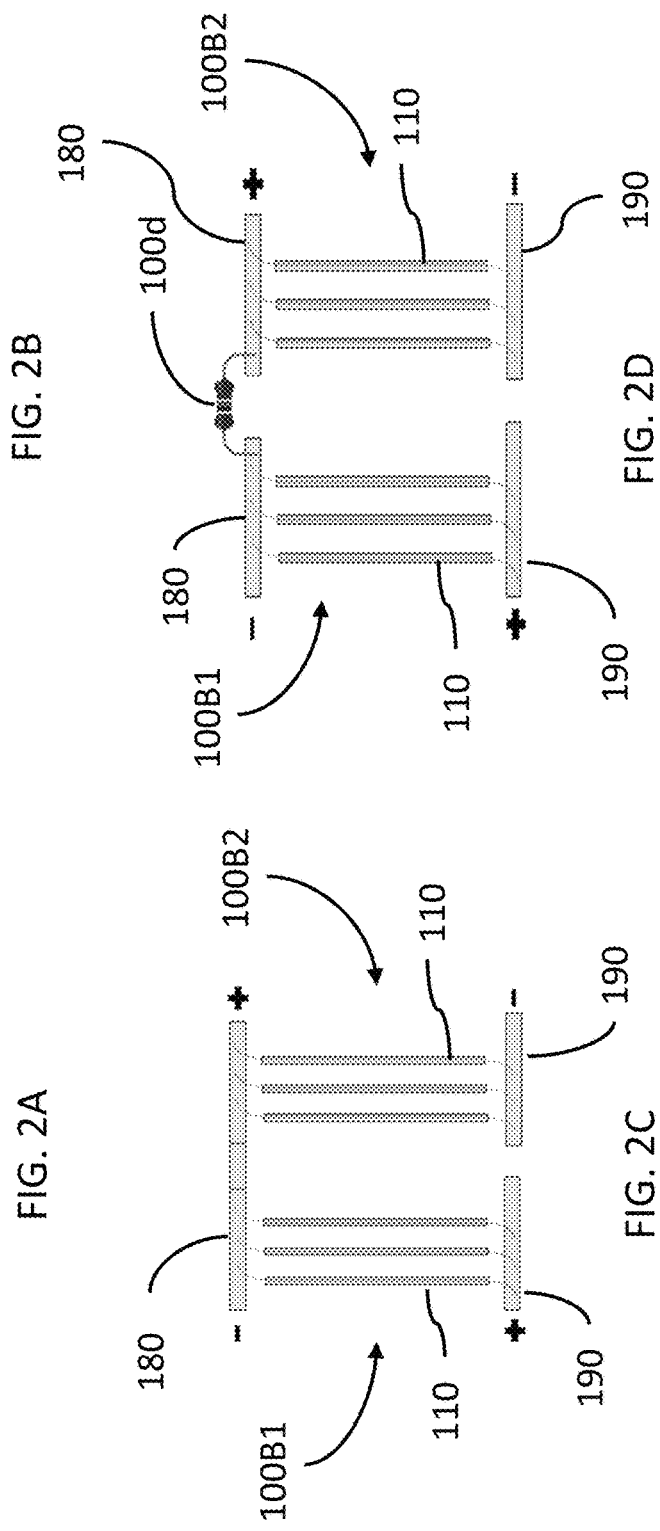

I-V curve depicting the essential PV characteristics of the 3 × 6 sq. in woven swatch

ELECTRICAL SYSTEM WITH HOOK-AND-LOOP BUSBARS

CROSS-REFERENCE TO RELATED APPLICATIONS

The present patent document claims priority to earlier filed U.S. Provisional Application Ser. No. 63/325,906, filed on Mar. 31, 2022, the entire contents of which are incorporated by reference in their entirety.

STATEMENT REGARDING FEDERALLY SPONSORED RESEARCH OR DEVELOPMENT

This invention was made with government support under Award ID. W911QY-18-2-0006 awarded by the Department of the Army, CCDC Soldier Center. The government has certain rights in the invention.

BACKGROUND OF THE INVENTION

1. Field of the Invention

The embodiments relate to electrical systems and more specifically to electrical systems with hook-and-loop busbars.

2. Background of the Related Art

Typical circuits may incorporate stiff busbar architectures to connect flexible/detachable electrical components with arc-welding or spot-welding as a method of establishing interconnections to maintain robust electrical contacts over long periods of time. Such existing methods for integrating (connecting) solid-state electronic fibers into soft circuit systems, which comprise the stiff busbar architectures, are often energy-intensive processes, with a lack of reconfigurability and the inability to easily integrate detachable electrical components. Other methods identified in U.S. Pat. No. 10,665,730 for a photovoltaic fabric with woven bus architecture, incorporated herein by reference in its entirety, incorporate a manual process in which the conducting wires are manually woven into a busbar. This renders the integration of electronic components such as diodes and resistors especially challenging.

BRIEF SUMMARY OF THE INVENTION

Disclosed is a flexible circuit module. The flexible circuit module includes a fabric member including a plurality of fibers having non-conductive elements, and conductive elements oriented through the plane of the fabric. Each conductive element includes a first fiber element strand and a first unterminated end opposite the first fiber element strand, and a second fiber element strand having second unterminated end opposite the second fiber element strand. The fabric member further includes a first side with the first fiber element strands extending therefrom and a second side with second fiber element strands extending therefrom. A first hook-and-loop busbar is conductively connected to the first fiber element strands and a second hook-and-loop busbar is conductively connected to the second fiber element strands. The strands may be removably connected to the busbars.

In addition to one or more aspects of the module, or as an alternate, the module includes a first conductive layer between the first fiber element strands and the first hook-and-loop busbar; and a second conductive layer between the second fiber element strands and the second hook-and-loop busbar.

In addition to one or more aspects of the module, or as an alternate, the hook-and-loop busbars have a sheet resistance that is 1 ohm/square or less.

In addition to one or more aspects of the module, or as an alternate, the fiber element strands include one or more electrically conductive primary working electrodes, surrounded by one or more of electrically conductive secondary counter electrodes.

In addition to one or more aspects of the module, or as an alternate, the fiber element strands are encapsulated in an optically transparent outer protective cladding. In some embodiments, the percent optical transmittance of the cladding may be in the near UV, visible and NIR region is at least 70% as measured by a spectrophotometer.

Further disclosed is a wearable garment including a circuit module having one or more of the aspects of the module disclosed herein.

Yet further disclosed is a system including: a plurality of circuit modules having one or more of the aspects of the module disclosed herein connected in series via one of the busbars in each of the circuit modules.

In addition to one or more aspects of the system, or as an alternate, the system includes one or more electrical components connected in series or in parallel between adjacent ones of the plurality of the circuit components or modules.

In addition to one or more aspects of the system, or as an alternate, the one or more of the electrical components is a resistor or a diode.

In addition to one or more aspects of the system, or as an alternate, the resistor is a through-hole resistor; or the diode is a bypass-diode or a blocking diode.

Further disclosed is a method of configuring a circuit module, including: providing a fabric member that includes fibers that are electrical, electronic, optoelectronic or optoelectrofluidic fibers, the fibers including: non-conductive elements; and conductive elements; that are oriented in the transverse, longitudinal or through the plane of the fabric; the fabric member including a first side with first fiber element strands extending therefrom and a second side with second fiber element strands extending therefrom; and conductively connecting a first hook-and-loop busbar to the first fiber element strands and a second hook-and-loop busbar conductively connected to the second fiber element strands.

In addition to one or more aspects of the method of configuring and reconfiguring the module, or as an alternate, the conductive elements may include a first fiber element strand and a first unterminated end opposite the first fiber element strand, and a second fiber element strand having second unterminated end opposite the second fiber element strand In addition to one or more aspects of the method of configuring and reconfiguring the module, or as an alternate, prior to conductively connecting the hook-and-loop busbars, the method includes: disposing a first conductive layer between the first fiber element strands and the first hook-and-loop busbar; and disposing a second conductive layer between the second fiber element strands and the second hook-and-loop busbar.

In addition to one or more aspects of the method of configuring and reconfiguring the module, or as an alternate, the hook-and-loop busbars have a sheet resistance that is 1 ohm/square or less.

In addition to one or more aspects of the method of configuring and reconfiguring the module, or as an alternate, the fiber element strands include one or more electrically conductive primary working electrodes, surrounded by one or more of electrically conductive secondary counter electrodes.

In addition to one or more aspects of the method of configuring and reconfiguring the module, or as an alternate, the fiber element strands are encapsulated in an optically transparent outer protective cladding. In some embodiments, the percent optical transmittance of the cladding may be in the near UV, visible and NIR region is at least 70% as measured by a spectrophotometer.

Yet further disclosed is a method of configuring and reconfiguring a wearable garment, including applying the circuit module formed by a method having one or more of the aspects of the method of configuring the module disclosed herein to the wearable garment.

Further disclosed is a method of configuring and reconfiguring a system, including: connecting a plurality of circuit modules formed by a method, having one or more of the aspects of the method of configuring the module disclosed herein, in series via one of the busbars in each of the circuit modules.

In addition to one or more aspects of the method of configuring the system, or as an alternate, the method includes connecting one or more electrical components in series between adjacent ones of the plurality of the circuit modules.

In addition to one or more aspects of the method of configuring and reconfiguring the system, or as an alternate, the one or more of the electrical components is a resistor or a diode.

In addition to one or more aspects of the method of configuring and reconfiguring the system, or as an alternate, the resistor is a through-hole resistor; or the diode is a bypass-diode or a blocking diode.

BRIEF DESCRIPTION OF THE SEVERAL VIEWS OF THE DRAWINGS

The present disclosure is illustrated by way of example and not limited in the accompanying figures in which like reference numerals indicate similar elements.

FIG. 2A shows a 1-wire parallel configuration providing a conductive hook-and-loop interconnect;

FIG. 2B shows a 3-wire parallel configuration;

FIG. 2C shows two 3-wire parallel modules connected in series;

FIG. 2D shows two 3-wire parallel modules incorporating a through-hole resistor connected in series;

DETAILED DESCRIPTION OF THE INVENTION

Figure 1A:
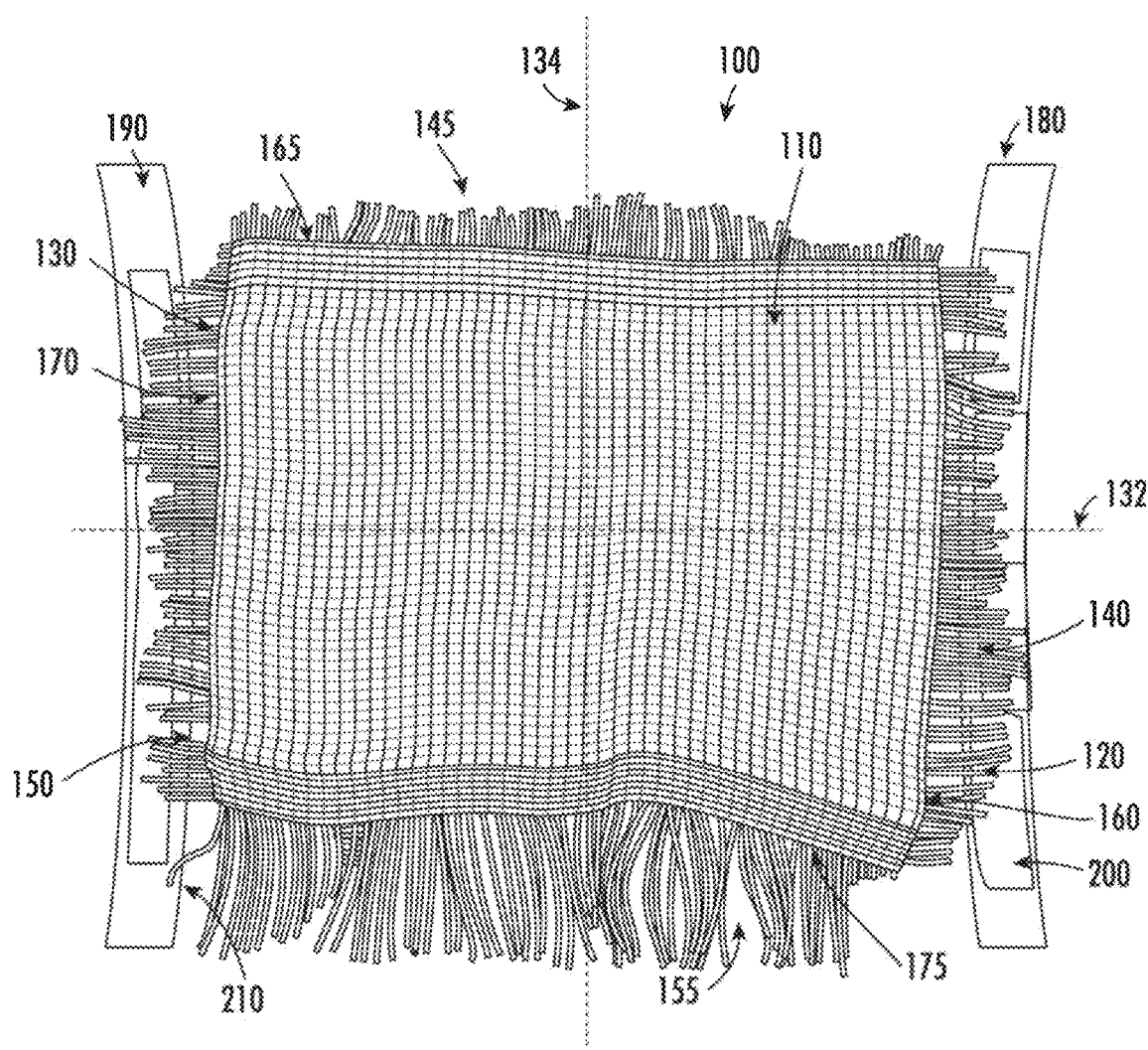
FIG. 1A shows a circuit module according to an embodiment.

Aspects of the disclosed embodiments will now be addressed with reference to the figures. Aspects in any one figure is equally applicable to any other figure unless otherwise indicated. Aspects illustrated in the figures are for purposes of supporting the disclosure and are not in any way intended on limiting the scope of the disclosed embodiments. Any sequence of numbering in the figures is for reference purposes only.

The disclosed embodiments provide a highly durable, conformable, and easily reconfigurable connection layout suitable to the wear and tear of soft wearable circuits. More specifically, turning to FIG. 1, the disclosed embodiments are directed to a circuit module 100 that is configured as a flexible and electrically conductive layout to establish robust, and reconfigurable electrical connections with low resistive losses between optoelectronic or optoelectrofluidic fiber-based devices and busbars in flexible/conformable circuits. The module 100, which provides for flexible and conformable circuits, can include electrical fabrics 110 which may be electronic textiles (e-textiles), solid-state fiber-based devices optoelectronic/optoelectrofluidic or power/energy harvesting and storage devices.

The fabric 110 is formed as a swatch with first and second sides 120, 130 that are opposite each other along a first transverse axis 132, having respective first and second sets of conductive fiber strands 140, 150. The conductive fiber strands 140, 150 extend from respective first and second selvage edges 160, 170 that extend along a second transverse axis 134 that is perpendicular to the first transverse axis 132. The conductive fiber strands 140, 150 are formed by weft fabric elements. Extending from third and fourth selvage edges 165, 175, which extend along the first transverse axis 132, are non-conductive fiber strands 145, 155 that extend along the second transverse axis 134. The non-conductive fiber strands 145, 155 are formed by warp fabric elements. The first and second transverse axes 132, 134 may be respectively referred to herein as the weft and warp directions.

The first and second sets of conductive fiber strands 140, 150 are respective first and second sets of electrodes having opposing polarity. First and second busbars 180, 190, respectively formed by first and second conductive hook-and-loop members 200, 210, respectively engage the first and second sets of fiber stands 140, 150 to form the circuit module 100. Reconfigurable electrical connections described herein can be used to connect devices in series or parallel and can also be used for electrically connecting or detaching other electrical components.

Figure 4A:
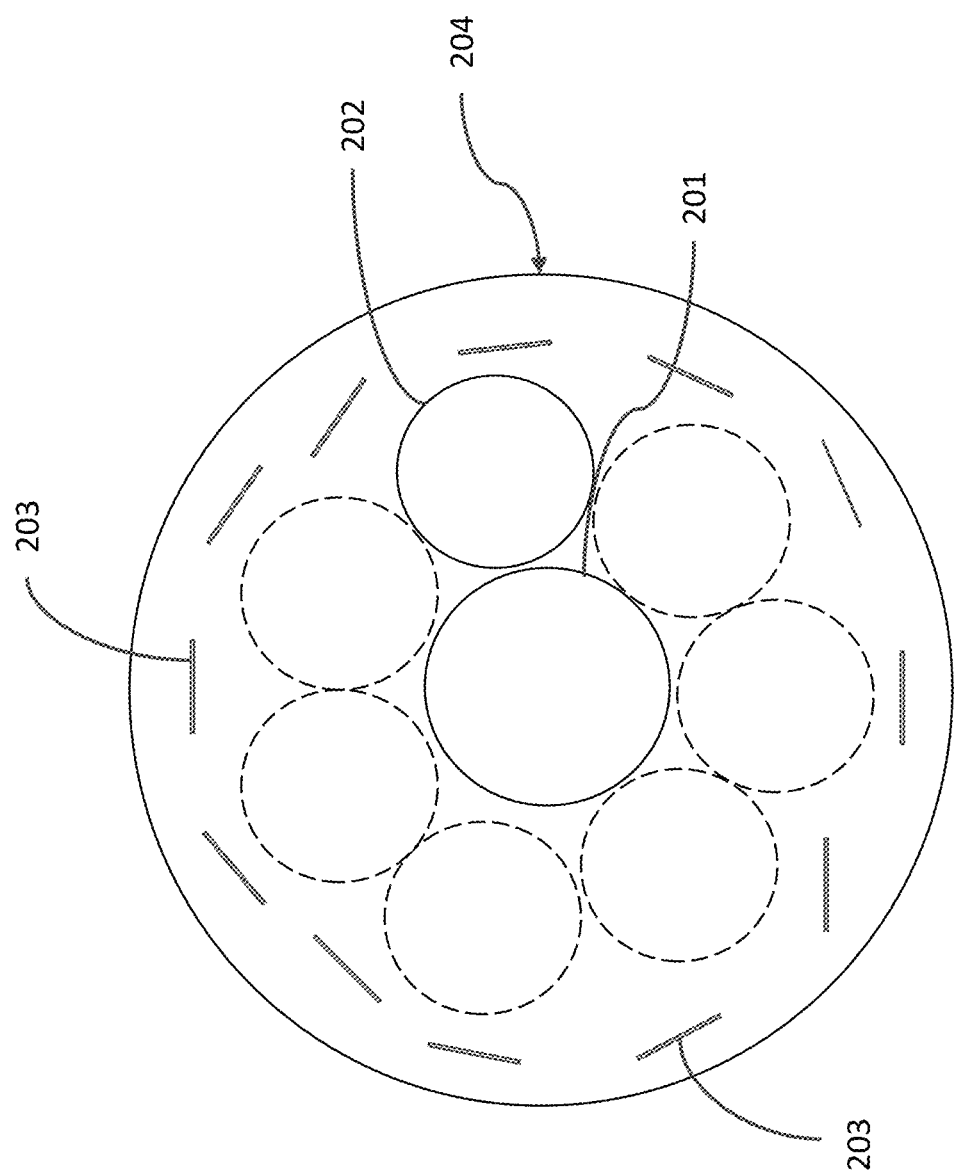
FIG. 4A shows a top view cross-section of an organic photovoltaic (OPV) fiber.
Figure 4B:
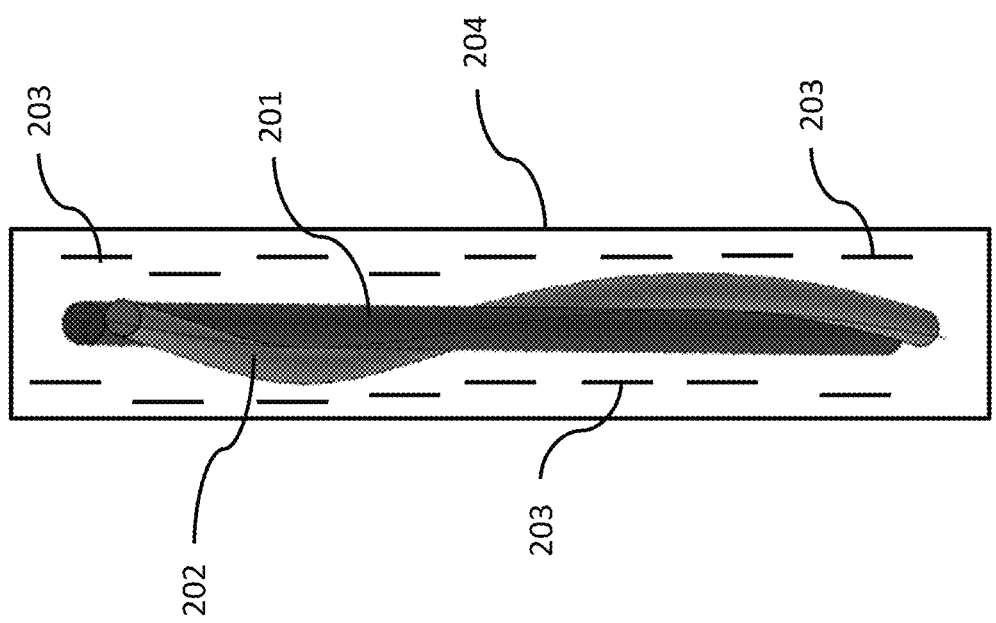
FIG. 4B shows a side-view cross-section of the OPV fiber.

Thus, the fabric shown in FIG. 1A includes a plurality of optoelectronic (or a power generation/storage device) or non-electric, non-conductive warp fibers. The warp can be conductive or non-conductive. The fabric includes a plurality of flexible optoelectronic or optoelectrofluidic weft elements. Each of the elements includes: i) one or more of the electrically conductive primary working electrode(s), ii) surrounded by one or more of the electrically conductive secondary counter electrode(s), encapsulated in an optically transparent outer protective cladding. FIGS. 4A and 4B respectively show a top-view cross-section of an OPV fiber and a side-view cross-section of the OPV wire. Both figures show a primary wire 201, secondary wires 202 that surround the primary wire 201, filler 203 that surrounds the secondary wires 202 and a UV curable cladding 204 that surrounds, i.e., encapsulates, the filler 203. In some embodiments, the percent optical transmittance of the cladding may be in the near UV, visible and NIR region is at least 70% as measured by a spectrophotometer. In the current configuration, the primary electrode (wire) is the negative and the secondary one is the positive. Though they can be the other way around depending on the materials used and how they are stacked.

Figure 1B:
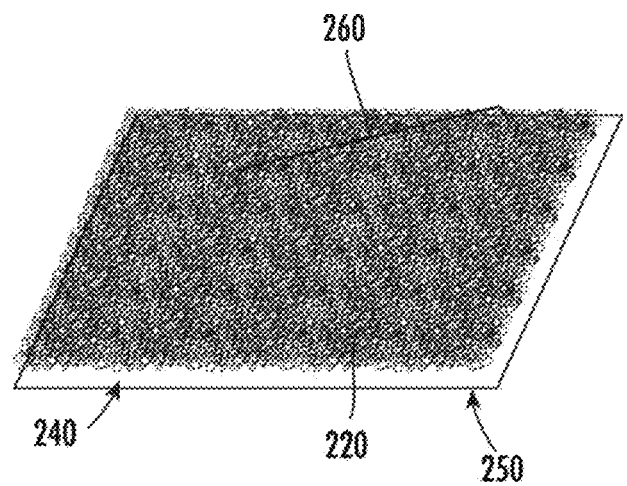
FIG. 1B shows a conductive fabric with a hook structure utilized for a busbar for the circuit module.
Figure 1C:
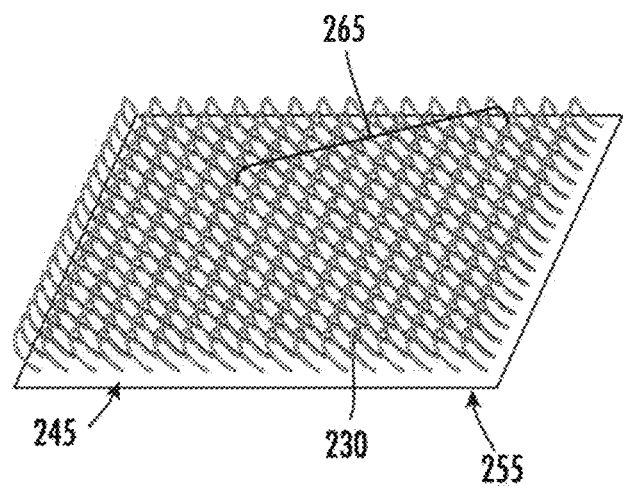
FIG. 1C shows a conductive fabric with a loop structure utilized for the busbar.
Figure 1D:
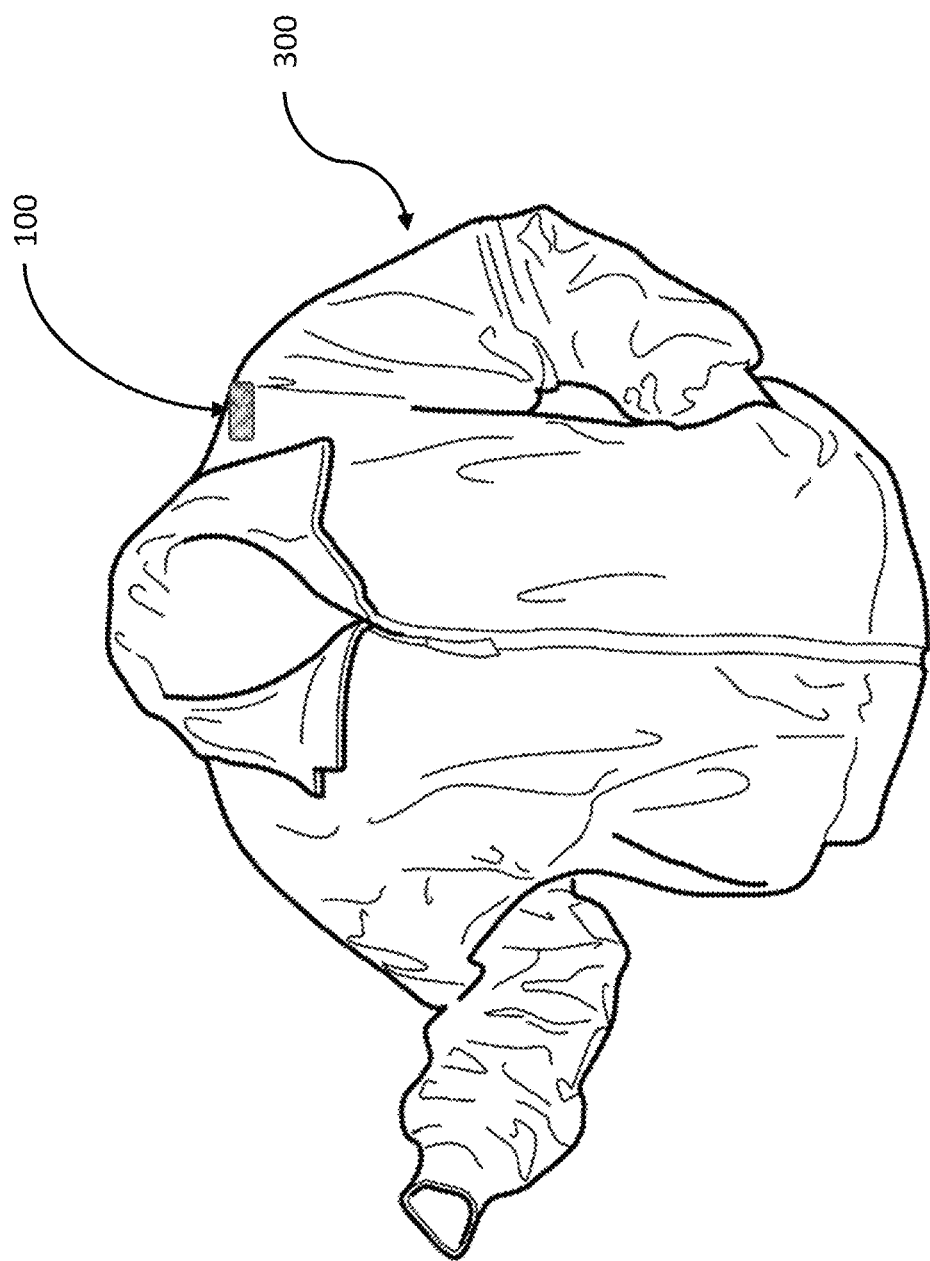
FIG. 1D shows an outwear with the circuit module.
Figure 3:
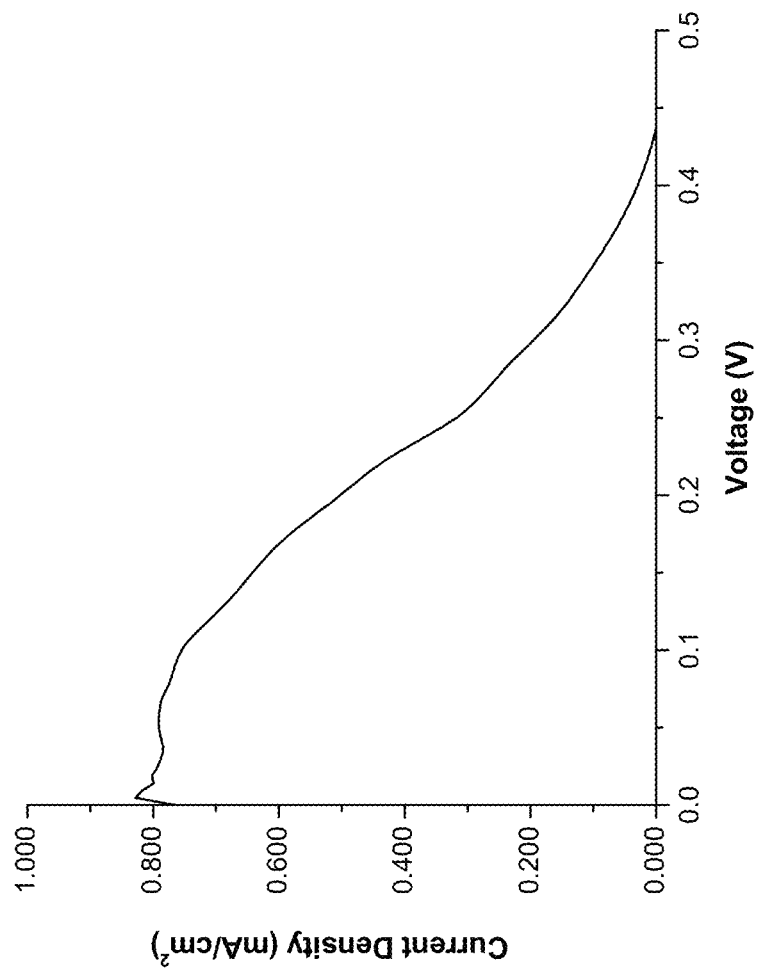
FIG. 3 shows a current density-voltage (J-V) curve depicting photovoltaic characteristics (under the illumination of an LED lamp) of the woven photovoltaic swatch module of FIG. 1A.

Turning to FIGS. 1B and 1C, the figures show the hook and loop components of each of the hook-and-loop members 200, 210 the conductive bus architecture. Each of the hook-and-loop members 200, 210 includes a hook member 220 and a loop member 230, having respective first and second fastener sides 240, 245 and respective first and second outer sides 250, 255 that oppose the fastener sides 240, 245. The bus architecture, via the fastener sides 240, 245, respectively includes first and second commercially available conductive layers 260, 265. The conductive layers 260, 265 may be formed by a conductive adhesive coating of the flexible thermoplastic hook and loop strap to which the electrodes, e.g., the sets of fiber strands 140, 150, of the fiber-based device, e.g., the circuit module 100, are connected. The conductive layer refers to a conductive adhesive composition that is used to secure and fasten the fiber-based electrodes on the conductive hook and loop strips. In some embodiments, the conductive layer is a thermally curable conductive composition. For instance, a composition comprising Digylcidyl Glycerol Ether (DGE) (2.65 wt %), Polyethylene Imine (PEI) (2.65 wt %), 1-butanol (1.5 wt %), and Ferro SF15ED Silver Flakes (79.6 wt %), cures between about 50-100° C. in under 5 minutes. Other conductive layers may be used.

Thus, the embodiments provide a robust, reconfigurable and flexible electrical connections including a circuit module 100, which is a soft circuit, including conductive hook-and-loop busbars to establish interconnections between optoelectronic or optoelectrofluidic fiber-based devices. One application of the disclosed embodiments is, e.g., soft garments 300 (FIG. 1D) such as outerwear.

The hook and loop device is akin to a conductive VEL-CRO® where both the hook and loop sides are conductive. A layer of an organic binder, with secondary silver coating passivated by a layer of nickel is coated and calendared over regular VELCRO® enabling conductivity on both domains. When the individual electrodes within the organic photovoltaic (OPV) fiber are separately positioned and connected to the VELCRO®, its conductivity enables the charge to be transported and utilized across external circuits. An exemplary application would constitute its utilization in soft-circuit system enabling integration with e-textiles and other electronic-wearable systems.

The fabric outerwear can comprise an electronic textile akin to that shown in FIG. 1, integrated on an underlying garment by utilizing the conductive hook and loop strips. Using a plurality of electrically conductive wires, the device is connected and used to power a charging port directly or can be used to charge a device through inductive coupling. There may include combinations of power management systems and/or power storage devices that stores the incoming charge carriers and ensures a steady voltage supply and current flow. Preferred configurations are inclusive of when the charging portal is positioned on the garment in the vicinity of the chest of an individual. More preferably, the garment is inclusive of a pocket that can hold an electronic device capable of being inductively charged (or directly powered) and has a nominal voltage below the operating voltage of the power storage device and preferably the electronic textile as shown in in FIG. 1.

EXAMPLES

To illustrate the robustness and reconfigurability of the electrically conductive bus architectures, OPV fibers were integrated into small modules both in parallel and serial-parallel configurations employing the conductive hook and loop layouts. These modules were characterized for their photovoltaic (PV) performance under 1 Sun (1,000 W/m^2 of solar irradiance) illumination using an AM1.5 G class AAA solar simulator or an LED based lamp at an intensity equivalent to 1 sun. Bending fatigue tests were performed on single-fiber modules with hook and loop bus architectures and the electrical resistance was synchronously monitored to verify the electrical contact under a constant bending fatigue load. Finally, a device having OPV weft fibers was woven on a Nomex (lightweight, heat-resistant aramid fiber used in clothing) warp background. Individual primary and secondary electrodes from the OPV fiber were positioned on the corresponding parallel hooks and loops bus architecture to from OPV fabric modules.

The disclosure identifies warp and weft elements of the fabric member. However, generally, it is to be appreciated that the fabric member includes fibers that are electrical, electronic, optoelectronic or optoelectrofluidic fibers, the fibers including: non-conductive elements; and conductive elements; that are oriented in the transverse, longitudinal or through the plane of the fabric.

Example 1

A four-point probe apparatus four-terminal connection method in conjunction with a constant current source of 4.53 mA and a digital multimeter were used to record the voltage drop to determine the surface resistivity and the DC resistance of individual 12-inch sections of the hook and loop busbar, respectively. The averaged surface resistivity and the averaged linear resistance for the hook and loop specimens are shown in Table 1. Measurements were performed on three (3) specimens to ensure consistency in the reported data.

TABLE 1

Results for the average surface resistivity and the average linear resistance for the hook and loop specimens

| Conductive Substrate | Surface resistivity for the hook (ohm/sq.) | Surface resistivity for the loop (ohm/sq.) | Average Linear Resistance for the hook (ohm/feet) | Average Linear Resistance for the loop (ohm/feet) |
| --- | --- | --- | --- | --- |
| 12-inch section of the conductive layout (n = 3) | 0.35 ± 0.04 | 0.05 ± 0.03 | 0.90 ± 0.05 | 0.90 ± 0.17 |

Surface resistivity values measured were less than 1 ohm/square for both the hook and loop specimens qualifying them as highly conductive electrical layouts to establish interconnections.

As shown in FIGS. 2a-2b, respective modules 100A, 100B are formed of individual electrodes from several 3.5-4.0 cm long OPV fibers of a fabric 110 were positioned and secured on the separate hook and loop busbars 180, 190 to establish a parallel connection between the primary and secondary electrodes. Two of modules 100B1, 100B1, which are the same as the module 100B shown in in FIG. 2B, were further reconfigured to establish a serial-parallel connection as shown in FIG. 2C.

As shown in FIG. 2D, to emphasize the facile integration of electrical and electronic components to the busbar, an electrical component, which may be a detachable through-hole resistor 100D (rating: 4.6 k$\Omega$±5%, 0.25 W) was serially positioned between the two parallel modules 100B1, 100B2. PV performance of the various configurations with the OPV fibers were characterized under 1 Sun using the AM 1.5 G solar simulator. The PV characteristics of the OPV modules incorporating the various configurations are shown in Table 2.

TABLE 2

Results from the PV testing of the various configurations of the OPV fibers

| Configuration(s) | Jsc (mA/cm^2) | Isc (mA) | Voc (mV) | FF (%) | PCE (%) | Series Resistance (ohm) | Shunt Resistance (ohm) |
|---|---|---|---|---|---|---|---|
| 1 wire in parallel (FIG. 2A) | 13.62 | 0.34 | 659.27 | 26.71 | 2.39 | 1.662 × 10^4 | 8.122 × 10^3 |
| 3 wires in parallel (FIG. 2B) | 14.05 | 1.09 | 649.53 | 26.12 | 2.38 | 5.081 × 10^3 | 2.221 × 10^3 |
| Two 3-wire parallel modules connected in series (FIG. 2C) | 7.24 | 1.05 | 1304.26 | 25.12 | 2.37 | 9.442 × 10^3 | 3.249 × 10^3 |
| Two 3-wire parallel modules incorporating a through-hole resistor connected in series (FIG. 2D) | 4.06 | 0.589 | 1271.09 | 27.96 | 1.44 | 1.920 × 10^4 | 7.720 × 10^3 |

Results from the PV characterization as shown Table 2 support the reconfigurability of the interconnection layout into various modular combinations, while simultaneously maintaining a good electrical contact.

As can be appreciated from the present disclosure, the net short-circuit current (Jsc) of a parallelly configurated the OPV fiber system is the sum of the photocurrent from each individual OPV fiber while the voltage is limited by the OPV fiber with the lowest Voc. As shown in Table 2, the obtained PV results for the parallel configurations align with the predicted values by the theory. That is, the Voc for the 3-wire parallel system does not exceed the Voc of a 1-wire parallel OPV configuration. It is to be appreciated that the embodiments are not limited to the number of wires identified in this disclosure and that the same are provided for exemplary purposes only.

Similarly, for a serial modular configuration, the net Voc generated by the parallel OPV fiber system connected in series is the sum of the Voc of each parallel module while the current is limited by the module with the lowest Jsc as it possesses the most resistance to the flow of charge carriers. As shown in Table 2, the measured PV results for the serial-parallel configurations also aligns with the anticipated values by the theory. That is, the Jsc for the 3-wire parallel modules connected in series does not exceed the photocurrent generated by a single 3-wire parallel module.

As seen in Table 2, the addition of the detachable through-hole resistor (rating: 4.6 k$\Omega$+5%, 0.25 W) to the serial-parallel module led to the increased the series resistance of the system from 9.442×10^3 ohm to 1.920×10^4 ohm. This allows for and is indicative of the attaching of external electrical and electronic components on the electrical layouts complementing the existing interconnections.

Example 2

Tensile testing in accordance with the ASTM F219-196 (2018) standard was performed on individual 254 mm long OPV fibers with a cross-sectional diameter of 320 μm on an Instron 5966 Universal Testing System. Individual electrodes from the OPV fiber specimens were attached to i) 1×4 sq·cm nickel strips by spot welding; and ii) conductive hook and loop busbars. Three specimens were tested at a strain rate of 1 inch/min and the yield strength, elongation at failure, and the ultimate tensile strength were recorded and presented in Table 3 (primary wire) and Table 4 (secondary wire).

TABLE 3

Results from tensile testing of the OPV fiber specimens comprising of the primary electrode attached to parallel i) Nickel and ii) hook and loop busbars

| Busbar architecture | Specimen | Tensile Strength (GPa) | Yield strength at 1% strain (MPa) | Elongation at break (%) |
|---|---|---|---|---|
| Nickle | 1 | 4.462 | — | 0.41 |
|  | 2 | 7.797 | — | 0.21 |
|  | 3 | 6.896 | — | 0.17 |
|  | Average | 6.385 ± 1.725 | — | 0.14 ± 0.08 |
| Conductive hook and loop | 1 | 13.091 | 5.590 | 16.18 |
|  | 2 | 12.219 | 5.343 | 20.92 |
|  | 3 | 13.514 | 5.591 | 19.57 |
|  | Average | 12.941 ± 0.660 | 5.508 ± 0.142 | 18.89 ± 2.44 |

TABLE 4

Results from tensile testing of the OPV fiber specimens
comprising of the secondary electrode attached to
parallel i) Nickel and ii) hook and loop busbars

| Busbar architecture | Specimen | Tensile Strength (MPa) | Yield strength at 1% strain (MPa) | Elongation at break (%) |
|---|---|---|---|---|
| Nickle | 1 | 1.501 | — | 0.05 |
| | 2 | 4.828 | — | 0.11 |
| | 3 | 3.634 | — | 0.07 |
| | Average | 3.321 ± 1.685 | — | 0.07 ± 0.03 |
| Conductive hook and loop | 1 | 7.457 | — | 0.37 |
| | 2 | 9.074 | — | 0.61 |
| | 3 | 8.605 | — | 0.24 |
| | Average | 8.378 ± 0.831 | — | 0.40 ± 0.18 |

The results from the tensile testing of the primary and secondary wire interconnections revealed that the specimens employing the electrically conductive hook and loop layouts were more robust at the interface in comparison to the spot welded specimens. As shown Tables 3 and 4, the averaged ultimate tensile strength for the interconnections on the conductive hook and loop busbar showed a 102.6% and 152.2% increase in comparison to their spot-welded counterparts for the primary and secondary wires, respectively. Yielding was observed at the interface for the interconnections comprising of the primary wire attached to the conductive hook and loop busbar with an averaged elongation at break of 18.89%. Although, the secondary wire interconnections attached to the conductive hook and loop busbar did not yield prior to failure, the averaged elongation at break was higher by 471.4% in compared to the secondary wire interconnections on the nickel busbar.

Example 3

Bending fatigue tests across 1,000 cycles were performed on 25.4 cm long OPV fiber specimens employing the nickel and conductive hook and loop bus architectures on an ElectroForce 3200 Mechanical tester. To evaluate the change in the resistance at the connection interface, either the primary or the secondary electrode was individually connected to the respective busbar architecture. The DC resistance was synchronously monitored and recorded using a 2-wire measurement setup at an applied potential of 10 mV using a Keithley 2450 Sourcemeter in conjunction with a computer and a Kickstart 2.4 data-acquisition software. Specimens were tested at a frequency of 1 Hz and a bending radius of 4 cm. The DC resistance was synchronously recorded once between each cycle. Results from the bending fatigue tests for the bus architectures incorporating the individual primary and secondary wires are presented in Table 5 and 6, respectively.

TABLE 5

Results from bending fatigue testing of the OPV fiber specimens comprising of the
primary electrode attached to parallel i) Nickel and ii) hook and loop busbars

| Busbar Architecture | Specimen | Resistance at 0 cycles (ohm) | Resistance at 250 cycles (ohm) | Resistance at 500 cycles (ohm) | Resistance at 750 cycles (ohm) | Resistance at 1000 cycles (ohm) |
|---|---|---|---|---|---|---|
| Nickel | 1 | 1.83 | Failed (>10^6) | Failed (>10^6) | Failed (>10^6) | Failed (>10^6) |
| | 2 | 1.83 | Failed (>10^6) | Failed (>10^6) | Failed (>10^6) | Failed (>10^6) |
| | 3 | 1.85 | Failed (>10^6) | Failed (>10^6) | Failed (>10^6) | Failed (>10^6) |
| Conductive hook and lop | 1 | 1.91 | 1.93 | 1.94 | 1.92 | 1.92 |
| | 2 | 1.89 | 1.92 | 1.92 | 1.95 | 1.99 |
| | 3 | 1.89 | 1.94 | 1.92 | 1.92 | 1.92 |

TABLE 6

Results from bending fatigue testing of the OPV fiber specimens comprising of the
secondary electrode attached to parallel i) Nickel and ii) hook and loop busbars

| Busbar Architecture | Specimen | Resistance at 0 cycles (ohm) | Resistance at 250 cycles (ohm) | Resistance at 500 cycles (ohm) | Resistance at 750 cycles (ohm) | Resistance at 1000 cycles (ohm) |
|---|---|---|---|---|---|---|
| Nickel | 1 | 1.91 | Failed (>10^6) | Failed (>10^6) | Failed (>10^6) | Failed (>10^6) |
| | 2 | 1.93 | Failed (>10^6) | Failed (>10^6) | Failed (>10^6) | Failed (>10^6) |
| | 3 | 1.89 | Failed (>10^6) | Failed (>10^6) | Failed (>10^6) | Failed (>10^6) |
| Conductive hook and lop | 1 | 1.98 | 2.02 | 2.04 | 2.01 | 2.04 |
| | 2 | 2.03 | 1.99 | 2.08 | 2.02 | 2.06 |
| | 3 | 2.01 | 2.04 | 2.02 | 2.14 | 2.13 |

These results demonstrated that both the primary and secondary wire interconnections by spot-welding to 1×4 sq·cm nickel strips were unable to maintain good electrical contact over the course of the bending fatigue tests and failed within 20 bending fatigue cycles. In contrast, the primary and secondary wire interconnections secured on the hook and loop busbar were able to maintain good electrical contact (with no changes in resistance) with the underlying substrates over the course of the entire (1,000 cycles) bending fatigue tests. The variation in the resistance for both the primary and secondary wire interconnections was <6% variation up to 1,000 cycles. This renders the conductive hook and loop busbar as a mechanically robust layout to establish interconnections and withstand the wear-and-tear associated with soft wearable circuits.

Example 4

Turning back to FIG. 1, the swatch may be a 3×6 inch-square OPV swatch which was woven using a Thread Controller 2 (TC-2) semi-automatic loom press in 8×1 satin weave configuration. Nomex was used as the warp yarn and the OPV fiber was woven in the weft direction. The electrodes were separately positioned on the conductive hook and loop busbars and fastened using a conductive adhesive. The module was then characterized for its PV performance under illumination from a Husky 5000 lumen LED (color temperature of 4000K) portable work light at an intensity equivalent to 1 sun (by positioning the lamp 10 cm above the module). The current-voltage (I-V) data was recorded utilizing an Abet solar cell I-V test system (Abet Technologies (Connecticut, USA)) in conjunction with a Keithley sourcemeter and a ReRa Tracer I-V software. An active area of 5 cm$^2$ (defined by the total length of the OPV fibers, 500 cm, and the diameter of the primary wire, 100 μm) was used to determine the current density and the PCE. Table 7 show the I-V characteristics of the woven swatch.

TABLE 7

PV performance of the 3 × 6 sq. in woven swatch

| Swatch Configuration | 3 × 6 sq.in woven swatch (parallel configuration) |
| --- | --- |
| Voc(V) | 0.445 |
| Jsc (mA/cm$^2$) | 0.797 |
| PCE (%) | 0.102 |
| FF(%) | 28.70 |

This supports the integration of the conductive hook-and-loop layout as a robust and versatile platform for rapidly configurable and seamlessly attachable interconnections for soft circuit systems.

Thus, the disclosed embodiments provide a woven fabric that includes flexible optoelectronic or optoelectrofluidic solid-state fibers, where individual fibers are electrically connected to robust, reconfigurable and flexible electrical layouts. The embodiments provide conductive hook-and-loop busbars separately interconnecting a plurality of individual primary and secondary electrodes. The conductive hook-and-loop busbars may have a sheet resistance no greater than 1 ohm/square. The fabric may be utilized as a wearable soft circuit system incorporating an interconnected modular network.

The fabric includes a plurality of electronic or non-electric, non-conductive warp fibers. The fabric includes a plurality of flexible electronic weft elements. Each of the elements includes: i) one or more of the electrically conductive primary working electrode(s), ii) surrounded by one or more of the electrically conductive secondary counter electrode(s), encapsulated in an optically transparent outer protective cladding. In some embodiments, the percent optical transmittance of the cladding may be in the near UV, visible and NIR region is at least 70% as measured by a spectrophotometer.

The plurality of detachable electrical and electronic components may include a conductive composition (adhesive) to secure the individual primary and secondary electrodes onto the conductive hook-and-loop busbars.

The disclosed embodiments provide a flexible busbar for solid-state fiber-based devices integrated into soft circuits. In the disclosed embodiments, electrical contacts on the flexible conductive busbar can be readily established or reconfigured and be further strengthened by the addition of thin sections of conductive adhesive. The disclosed embodiments improve upon configurations that incorporate stiff busbar architectures with arc-welding or spot-welding as a method of establishing interconnections to maintain robust electrical contacts over long periods of time. The disclosed embodiments also improve upon methods that incorporate a manual process in which the conducting wires are manually woven into a busbar.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

Those of skill in the art will appreciate that various example embodiments are shown and described herein, each having certain features in the particular embodiments, but the present disclosure is not thus limited. Rather, the present disclosure can be modified to incorporate any number of variations, alterations, substitutions, combinations, sub-combinations, or equivalent arrangements not heretofore described, but which are commensurate with the scope of the present disclosure. Additionally, while various embodiments of the present disclosure have been described, it is to be understood that aspects of the present disclosure may include only some of the described embodiments. Accordingly, the present disclosure is not to be seen as limited by the foregoing description, but is only limited by the scope of the appended claims.

What is claimed:

1. A reconfigurable flexible circuit module, comprising:
a fabric member comprising a plurality of fibers having non-conductive elements, and conductive elements oriented through the plane of the fabric, each conductive element comprising a first fiber element strand and a first unterminated end opposite the first fiber element strand, and a second fiber element strand having second unterminated end opposite the second fiber element strand;
the fabric member further comprising a first side with the first fiber element strands extending therefrom and a second side with second fiber element strands extending therefrom; and a first hook-and-loop busbar conductively connected to the first fiber element strands and a second hook-and-loop busbar conductively connected to the second fiber element strands, wherein the first hook-and-loop busbar are removably connected to the first fiber element strands and a second hook-and-loop busbar removably connected to the second fiber element strands.

2. The module of claim 1, further comprising:
a first conductive layer between the first fiber element strands and the first hook-and-loop busbar; and
a second conductive layer between the second fiber element strands and the second hook-and-loop busbar.

3. The module of claim 2, wherein the hook-and-loop busbars have a sheet resistance that is 1 ohm/square or less.

4. The module of claim 1, wherein each conductive element is encapsulated in an optically transparent outer protective cladding.

5. The module of claim 1, wherein the conductive elements are electrical, optoelectronic or optoelectrofluidic fibers.

6. A system of reconfigurable flexible circuit modules, comprising:
a plurality of the circuit modules, comprising:
a fabric member comprising a plurality of fibers having non-conductive elements, and conductive elements oriented through the plane of the fabric, each conductive element comprising a first fiber element strand and a first unterminated end opposite the first fiber element strand, and a second fiber element strand having second unterminated end opposite the second fiber element strand;
the fabric member further comprising a first side with the first fiber element strands extending therefrom and a second side with second fiber element strands extending therefrom; and
a first hook-and-loop busbar conductively connected to the first fiber element strands and a second hook-and-loop busbar conductively connected to the second fiber element strands;
the plurality of flexible circuit modules connected in series via one of the hook-and-loop busbars in each of the plurality of flexible circuit modules, wherein the first hook-and-loop busbar are removably connected to the first fiber element strands and a second hook-and-loop busbar removably connected to the second fiber element strands.

7. The system of claim 6, further comprising:
one or more electrical components are removably connected in series or in parallel between adjacent ones of the plurality of the circuit components or modules.

8. The system of claim 7, wherein the one or more of the electrical components is a diode.

9. The system of claim 8, wherein the resistor is a bypass-diode or a blocking diode.

10. A method of configuring and reconfiguring a flexible circuit module, comprising:
forming a flexible circuit module, the flexible circuit module, comprising:
providing a fabric member comprising a plurality of fibers having non-conductive elements, and conductive elements oriented through the plane of the fabric, each conductive element comprising a first fiber element strand and a first unterminated end opposite the first fiber element strand, and a second fiber element strand having second unterminated end opposite the second fiber element strand;
the fabric member further comprising a first side with the first fiber element strands extending therefrom and a second side with second fiber element strands extending therefrom; and
wherein the step of connecting a first hook-and-loop busbar conductively to the first fiber element strands and a second hook-and-loop busbar conductively to the second fiber element strands.

11. The method of claim 10, wherein prior to connecting the hook-and-loop busbars, the method further comprises:
disposing a first conductive layer between the first fiber element strands and the first hook-and-loop busbar; and
disposing a second conductive layer between the second fiber element strands and the second hook-and-loop busbar.

12. The method of claim 10, further comprising:
removably connecting a plurality of circuit modules in series via one of the busbars in each of the plurality of circuit modules.

13. The method of claim 12, further comprising removably connecting one or more electrical components in series between adjacent ones of the plurality of the circuit modules.

14. The method of claim 13, wherein the one or more of the electrical components is a resistor, through-hole resistor, a diode, or blocking diode.

15. The method of claim 10, further comprising:
providing a flexible substrate having reciprocal hook-and-loop fasteners; and
connecting the hook-and-loop busbars on the flexible circuit module to the hook-and-loop fasteners on the flexible substrate.

16. The method of claim 15, wherein the flexible substrate is a garment.

17. The method of claim 10, further comprising:
conductively connecting the hook-and-loop busbars on the flexible circuit module to the hook-and-loop fasteners on the flexible substrate; and
providing an electrical current to a device in the flexible substrate through the hook-and-loop fasteners on the flexible substrate.

* * * * *